United States Patent [19]

Hiraki et al.

[11] 4,451,303
[45] May 29, 1984

[54] DIFFUSION OF ALUMINUM

[75] Inventors: Shunichi Hiraki, Hiratsuka; Kiyoshi Kikuchi, Yokohama; Shigeo Yawata, Kawasaki; Masafumi Miyagawa, Kitakyushu, all of Japan

[73] Assignee: Tokyo Shibaura Denki Kabushiki Kaisha, Japan

[21] Appl. No.: 455,795

[22] Filed: Jan. 5, 1983

[30] Foreign Application Priority Data

Jan. 18, 1982 [JP] Japan .................................. 57-5026

[51] Int. Cl.$^3$ .................. H01L 21/225; H01L 21/265
[52] U.S. Cl. ..................................... 148/187; 148/1.5; 148/188
[58] Field of Search .................... 148/1.5, 187, 188

[56] References Cited

U.S. PATENT DOCUMENTS

| | | | |
|---|---|---|---|
| 4,063,967 | 12/1977 | Graul et al. | 148/1.5 |
| 4,199,386 | 4/1980 | Rosnowski et al. | 148/188 |
| 4,290,830 | 9/1981 | Mochizuki et al. | 148/187 |
| 4,351,677 | 9/1982 | Mochizuki et al. | 148/188 |
| 4,389,255 | 6/1983 | Chen et al. | 148/1.5 |
| 4,393,577 | 7/1983 | Imai | 148/187 X |

FOREIGN PATENT DOCUMENTS 1536545 12/1978 United Kingdom.

OTHER PUBLICATIONS

Baliga, "Deep Planar Gallium and Aluminum Diffusion in Silicon", J. Electrochem. Soc.: Solid-State Science and Technology, pp. 292-296, Feb. 1979.

Primary Examiner—G. Ozaki
Attorney, Agent, or Firm—Finnegan, Henderson, Farabow, Garrett & Dunner

[57] ABSTRACT

A method for producing a semiconductor element which can form a deep P-type impurity region by a diffusion of aluminum. A porous alumina layer is first formed on a semiconductor substrate. Then, a diffusion-protective layer formed of a material having a large oxygen-diffusion-inhibiting ability such as $Al_2O_3$ is formed on the porous alumina layer. Subsequently, aluminum ions are implanted in the porous alumina layer through the diffusion-protective layer. Thereafter, a heat treatment is performed to diffuse the aluminum of the aluminum ion-implanted region in the semiconductor substrate, and a P-type impurity region is formed. Alternatively, a porous alumina layer is formed on the semiconductor substrate, and an aluminum layer is then formed thereon. The diffusion-protective layer is formed on the aluminum layer, and a heat treatment is then performed, thereby diffusing the aluminum forming the aluminum layer in the semiconductor substrate, and a P-type impurity region is thus formed.

6 Claims, 8 Drawing Figures

DIFFUSION OF ALUMINUM

BACKGROUND OF THE INVENTION

I. Field of the Invention

The present invention relates to a method for producing a semiconductor element and, more particularly, to a method for producing a semiconductor element which comprises the step of diffusing aluminum in a semiconductor substrate to form a P-type impurity region.

II. Description of the Prior Art

Group III elements are commonly used to form a P-type impurity region in a semiconductor substrate. The element of the III group elements, which is used most often is boron. This is because the solid solution degree of boron in silicon is large, so that a high density impurity region can be formed, and secondly, because the boron can be readily diffused in a semiconductor with a silicon oxide layer as a mask.

However, in a high withstand and high power device, a deep P-N junction is required in order to provide the most desirable characteristics. Accordingly, in order to produce a high withstand and high power device by a diffusion of a P-type impurity in an N-type semiconductor substrate, a technique for forming a deep P-type impurity region is necessary. For example, in a device of the type having a withstanding voltage of 4,000 V, a diffusion depth of approximately 130 $\mu$m is required. To form such a deep P-type impurity region, it is logical to employ the III group impurities having the highest diffusion coefficient in silicon. The diffusion coefficients ($\sqrt{D}$) of the III group elements in silicon at 1,200° C. are 0.6 $\mu$m/$\sqrt{hr}$ for boron, 0.8 $\mu$m/$\sqrt{hr}$ for gallium, 0.56 $\mu$m/$\sqrt{hr}$ for indium and thallium, and 2.5 $\mu$m/$\sqrt{hr}$ for aluminum. Therefore, when aluminum is used as an impurity, the diffusion junction of the required depth can be formed at the lowest temperature for the shortest time.

A technique for forming a P-type impurity region by a diffusion of aluminum in a silicon substrate is known. In this conventional technique, a metallic aluminum layer is first deposited on the silicon substrate. Then, a diffusion protective layer made of $SiO_2$ is formed on the metallic aluminum layer. Subsequently, this structure is heated to diffuse the aluminum forming the metallic aluminum layer in the silicon substrate, and a P-type impurity region is formed.

However, this conventional technique has the following drawbacks and disadvantages, and so is not widely used.

(A) Aluminum has a low melting point and is subjected to ready oxidation and, once oxidized, the diffusion of the aluminum is blocked, and the control of the formation of the diffused layer cannot be performed. This problem can be solved when the diffusing step is carried out in a high vacuum such as $10^{-7}$ Torr, but this step has a drawback of a high cost in the workability of the device.

(B) Silicon and metallic aluminum deposited on the silicon react to form an alloy layer. As a result, the surface of the silicon substrate is whitened after the diffusion of the aluminum, and an alloy pit is produced.

(C) $SiO_2$ passes aluminum relatively easily. Thus, when the aluminum is diffused in the silicon substrate, the aluminum is also diffused in the $SiO_2$ layer. In other words, a so called out-diffusion tends to undesirably take place.

SUMMARY OF THE INVENTION

Accordingly, it is an object of the present invention to provide a method for producing a semiconductor element which can form a deep P-type impurity region by a diffusion of aluminum.

It is another object of the present invention to provide a method for producing a semiconductor element which can prevent the oxidation of aluminum during a diffusing step and results in the formation of a deep P-type impurity region under good controllability.

It is a further object of the present invention to provide a method for producing a semiconductor element which can eliminate the whitened surface of a semiconductor substrate and the production of an alloy pit on the surface of the substrate after aluminum is diffused in the substrate.

It is still another object of the present invention to provide a method for producing a semiconductor element which can eliminate out-diffusion when aluminum is diffused in a semiconductor substrate.

According to a method for producing a semiconductor element of the present invention, a porous alumina layer is first formed on a semiconductor substrate. Subsequently, a diffusion-protective layer which is formed of a material having large oxygen-diffusion-inhibiting ability is formed on the porous alumina layer, and aluminum ions are implanted in the porous alumina layer through the diffusion-protective layer. Then, the structure is heated to diffuse the aluminum in the semiconductor substrate, thereby forming a P-type impurity region. Alternatively, a porous alumina layer is formed on a semiconductor substrate, and then an aluminum layer is formed on the porous alumina layer. Subsequently, a diffusion-protective layer which is formed of a material having a large oxygen-diffusion-inhibiting ability is formed on the aluminum layer, and then the structure is heated to diffuse the aluminum forming the aluminum layer in the semiconductor substrate, thereby forming a P-type impurity region.

According to a method for producing a semiconductor element of the present invention, a diffusion-protective film formed of a material which has a large oxygen-diffusion-inhibiting ability such as, for example, aluminum oxide, silicon nitride, silicon carbide or aluminum nitride is employed. Accordingly, the oxidation of aluminum during the diffusing step can be prevented. As a result, a deep aluminum diffusion region can be controllably formed without inhibition of the diffusion of the aluminum. Such a material having a large oxygen-diffusion-inhibiting ability passes very little aluminum. Therefore, out-diffusion does not substantially take place during the diffusion step. Further, according to a method for producing a semiconductor element of the present invention, the aluminum layer becoming a diffusion source and the semiconductor substrate are isolated via the porous alumina layer. Accordingly, both the whitening phenomenon of the surface of the substrate and the production of an alloy pit, which are caused by the reaction of the aluminum layer with the semiconductor substrate, can be prevented. Further, the diffusion parameter ($\rho_s$, $X_j$) may be controlled with high precision since aluminum atoms can be diffused into the Si substrate without seemingly being affected by interaction with the porous alumina.

BRIEF DESCRIPTION OF THE DRAWINGS

The invention is best understood by reference to the accompanying drawings of which.

DETAILED DESCRIPTION OF THE PREFERRED EMBODIMENTS

The preferred embodiments of the present invention will now be described in more detail with reference to the accompanying drawings.

Figure 1:
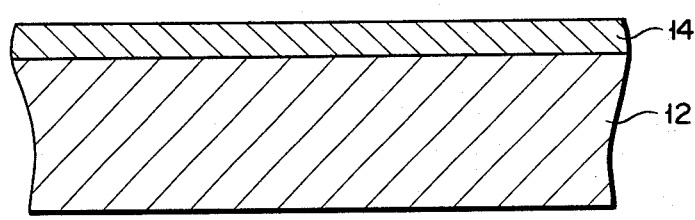
FIGS. 1 to 8 are schematic sectional views for describing preferred embodiments of a method for producing a semiconductor element of the present invention.

In a method for producing a semiconductor element of the present invention, a porous alumina layer 14 is first formed, as shown in FIG. 1, on a semiconductor substrate 12. The porous alumina layer 14 may be formed by forming an aluminum layer on the substrate 12 and subjecting it to an anodic oxidation. To form the aluminum layer on the substrate, any of the well-known techniques such as a sputtering method or a CVD method may be employed. The thickness of the aluminum layer depends upon a predetermined depth of a P-type impurity region to be formed, and is normally 0.1 to 1 $\mu$m. The electrolyte of an anodic oxidation may include dilute organic acid such as aqueous oxalic acid solution, and inorganic acid such as dilute sulfuric acid. The preferable electrolyte is a 10%-aqueous oxalic acid solution. In the case of an anodic oxidation, platinum may be, for example, used as a cathode. The thickness of the porous alumina layer formed by the anodic oxidation depends upon the thickness of the aluminum layer to be anodically oxidized, and is normally 50 nm to 1.0 $\mu$m.

Figure 2:
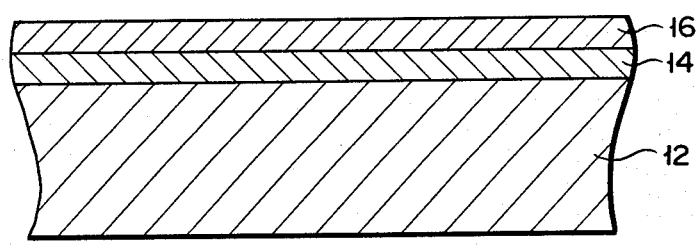

In the preferred first embodiment of a method for producing a semiconductor element of the present invention, a diffusion-protective layer 16 which is formed of a material having large oxygen-diffusion-inhibiting ability is formed, as shown in FIG. 2, on the porous alumina layer 14. The diffusion-protective layer 16 is formed, for example, of aluminum oxide, silicon nitride, silicon carbide or aluminum nitride. A particularly preferred material is aluminum oxide. The preferred thickness of the layer 16 is 50 to 300 nm. If the thickness is smaller than 50 nm, the interruption of the oxygen becomes insufficient. If the thickness is larger than 300 nm, a crack is readily produced. The diffusion-protective layer 16 may be formed by well-known techniques which include a CVD method and a sputtering method.

Figure 3:
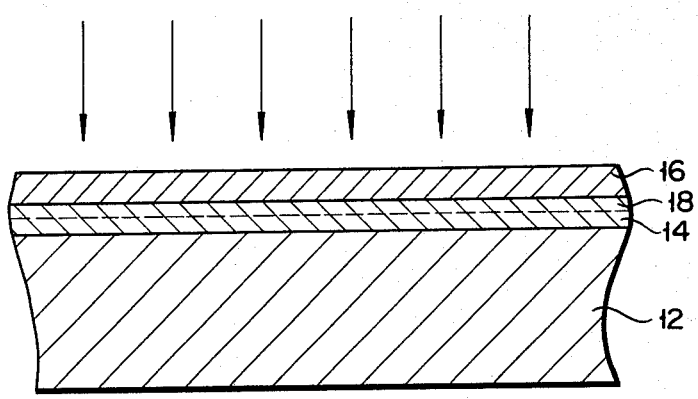

Then, aluminum ions are implanted, as shown in FIG. 3, into the porous alumina layer 14 through the diffusion-protective layer 16, thereby forming an aluminum ion-implanted region 18 in the layer 14. The aluminum ion-implanted region 18 is preferably formed in the portion except the vicinity of the boundary between the porous alumina layer 14 and the semiconductor substrate 12, and particularly in the surface layer. The dosage of the aluminum ions to be implanted is arbitrarily selected in accordance with the desired impurity density of the P-type impurity region to be formed. The implantation energy depends upon the thickness of the diffusion-protective layer 16. If the layer 16 is thin, the implantation energy is small, and if the layer 16 is thick, the energy is large. When the thickness of the layer 16 is 50 nm, the energy is normally approximately 120 keV, and when the thickness is 300 nm, the energy is approximately several hundred keV.

Figure 4:
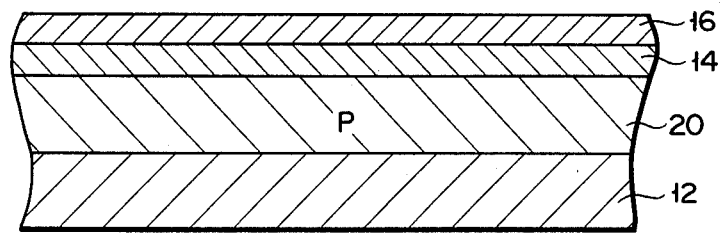

Subsequently, this structure is heated, the aluminum in the aluminum ion-implanted region 18 is diffused in the semiconductor substrate 12, and a P-type impurity region 20 is formed in the substrate, as shown in FIG. 4. The temperature of the diffusing step is normally 1,000 to 1,250° C., and where the diffusion depth is about 100 $\mu$m, the temperature employed is 1,250° C., the diffusion time is normally 11 hours.

Figure 5:
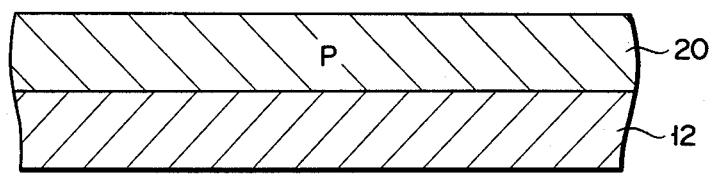

When the porous alumina layer 14 and the diffusion protective layer 16 are eventually removed, the semiconductor substrate 12 having the P-type diffusion layer 20 is obtained, as shown in FIG. 5. This removal of the layers is performed, for example, using a liquid mixture of chromic acid and phosphoric acid or aqua regia.

Figure 6:
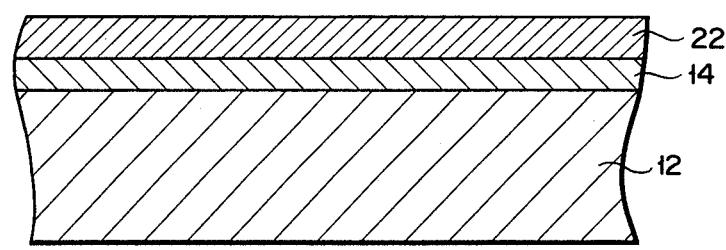

In the second preferred embodiment of a method for producing a semiconductor element of the present invention, a porous alumina layer 14 is formed, as shown in FIG. 1, on a semiconductor substrate 12, and aluminum layer 22 is then formed, as shown in FIG. 6, on the porous alumina layer 14. The formation of the aluminum layer 22 may employ a well-known technique such as a CVD method or a sputtering method. The thickness of the aluminum layer 22 is normally 50 nm to 1.0 $\mu$m.

Figure 7:
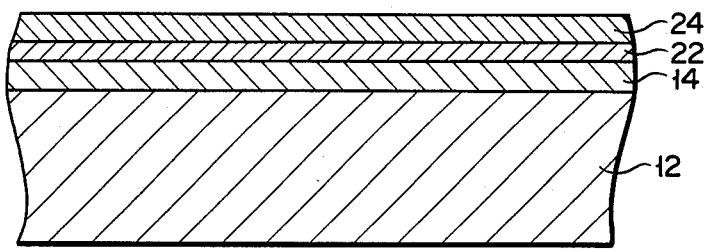

Subsequently, a diffusion-protective layer which is formed of a material having a large oxygen-diffusion-inhibiting ability such as, for example, aluminum oxide, silicon nitride, silicon carbide or aluminum nitride is formed on the aluminum layer 22. The step of forming the diffusion-protective layer may be performed in the same manner as the step of forming the diffusion-protective layer described in the above first embodiment. However, as shown in FIG. 7, the top of the aluminum layer 22 is converted into a nonporous alumina layer 24 by an anodic oxidation, and the nonporous alumina layer 24 may be used as a diffusion-protective layer.

Figure 8:
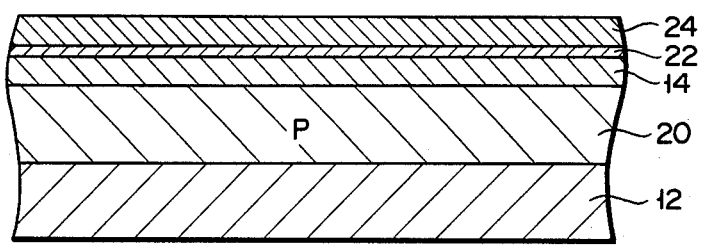

Subsequently, this structure is heated, the aluminum forming the aluminum layer 22 is diffused in the semiconductor substrate 12 through the porous alumina layer 14, and a P-type impurity region 20 is formed, as shown in FIG. 8, in the semiconductor substrate 12. This diffusing step may be performed in the same manner as the diffusing step in the first embodiment.

When the porous alumina layer 14, the remaining aluminum layer 22 and the diffusion-protective layer 24 are then removed in the same manner as the first embodiment, a semiconductor substrate 12 having a P-type impurity region 20 can be obtained, as shown in FIG. 5.

EXAMPLE 1

An aluminum layer approx. 500 nm thick was formed on an N-type silicon substrate. This aluminum layer was subjected to an anodic oxidation in 10%-aqeuous oxalic acid solution with a current density of 0.1 A/dm$^2$ for about 10 min. with platinum as a cathode, and was converted into a porous aluminum layer about 1.0 $\mu$m thick. Then, an aluminum oxide layer was covered by a CVD method on the porous alumina layer to a thickness of approximately 50 nm. Thereafter, $^{27}$Al+ was implanted in the porous alumina layer through the aluminum oxide layer in a dosage of $3 \times 10^{14}$ ions/cm$^2$ with an acceleration voltage of 120 keV. This structure was left in a nitrogen atmosphere at 1,250° C. for 11 hours, and the aluminum of the ion implanted region was diffused in the N-type silicon substrate. Thus, a P-type impurity diffusion region of $p_s = 30 \cdot 106/D$ in a depth of 100 $\mu$m was formed. The porous alumina layer and the CVD alumina layer was removed by a mixture liquid of chromic acid and phosphoric acid ($CrO_3 + H_3PO_4 + H_2O = 64$ g + 120 ml + 400 ml), and an N-type silicon substrate having the P-type diffused region was obtained.

No whitening phenomenon nor alloy layer locus were observed on the main surface of the diffused region side of the silicon substrate which was obtained.

EXAMPLE 2

A porous alumina layer was formed on an N-type silicon substrate in the same manner as in Example 1. An aluminum layer of 50 nm thick was formed on the porous alumina layer. This aluminum layer was subjected to an anodic oxidation in 1 wt%-aqeuous ammonium borate solution with an applying voltage of about 50 V for about 10 min., and a surface region approximately 50 nm thick was converted into nonporous alumina. Then, this was heat-treated at 1,250° C. in a nitrogen atmosphere for 11 hours, and a P-type impurity diffused region was formed in the N-type silicon substrate. Thereafter, the porous alumina layer, the remaining aluminum layer and the nonporous alumina layer were removed in the same manner as in Example 1, and a silicon substrate having a P-type diffused region was obtained.

No whitening phenomenon nor alloy layer locus were observed on the main surface of the diffused region side of the silicon substrate obtained.

What we claim is:

1. A method for producing a semiconductor element comprising the steps of:
   forming a porous alumina layer on a semiconductor substrate;
   forming a diffusion-protective layer formed of a material having a large oxygen-diffusion-inhibiting ability on said porous alumina layer;
   implanting aluminum ions into said porous alumina layer through said diffusion-protective layer to form an aluminum ion-implanted region in said porous alumina layer; and
   heating the structure thus formed to diffuse the aluminum in said aluminum ion-implanted region into said semiconductor substrate, thereby forming a P-type impurity region in said semiconductor substrate.

2. The method according to claim 1, wherein said diffusion-protective layer is formed of a material selected from the group consisting of aluminum oxide, silicon nitride, silicon carbide and aluminum nitride.

3. The method according to claim 1, wherein said aluminum ions are implanted in the surface portion of said porous aluminum layer.

4. A method for producing a semiconductor element comprising the steps of:
   forming a porous alumina layer on a semiconductor substrate;
   forming an aluminum layer on said porous alumina layer;
   forming a diffusion-protective layer formed of a material having a large oxygen-diffusion-inhibiting ability on said aluminum layer; and
   heating the structure thus formed to diffuse the aluminum forming said aluminum layer through said porous aluminum layer into said semiconductor substrate, thereby forming a P-type impurity region in said semiconductor substrate.

5. The method according to claim 4, wherein said diffusion-protective layer is formed of a material selected from the group consisting of aluminum oxide, silicon nitride, silicon carbide and aluminum nitride.

6. The method according to claim 4, wherein said diffusion-protective layer is formed by converting the surface layer of said aluminum layer into a nonporous alumina layer.

* * * * *